United States Patent
Komurasaki et al.

[11] Patent Number: 6,127,892
[45] Date of Patent: Oct. 3, 2000

[54] AMPLIFICATION CIRCUIT

[75] Inventors: Hiroshi Komurasaki; Kimio Ueda; Hisayasu Satoh, all of Tokyo, Japan

[73] Assignee: Mitsubishi Denki Kabushiki Kaisha, Tokyo, Japan

[21] Appl. No.: 09/173,618

[22] Filed: Oct. 16, 1998

[30] Foreign Application Priority Data

May 7, 1998 [JP] Japan .............................. P10-124711

[51] Int. Cl.[7] .................. H03F 3/16; H03F 3/14
[52] U.S. Cl. ............................ 330/277; 330/307
[58] Field of Search ................... 330/277, 296, 330/307

[56] References Cited

U.S. PATENT DOCUMENTS 3,405,330  10/1968  Hilbiber .................. 330/277
5,559,892   9/1996  Boor ...................... 330/277

FOREIGN PATENT DOCUMENTS 6-224653  8/1994  Japan .

OTHER PUBLICATIONS

Takakuni Douseki, et al., "A 0.5V SIMOX–MTCMOS Circuit With 200ps Logic Gate", IEEE International Solid–State Circuits Conference, Digest of Technical Papers, Feb. 1996, pp. 84–85.

Tsuneaki Fuse, et al., "0.5V SOI CMOS Pass–Gate Logic", IEEE International Solid–State Circuits Conference, Digest of Technical Papers, Feb. 1996, pp. 88–89.

Grebene, Alan B.: Bipolar and MOS analog integrated circuit design, New York [et al.]: John Wiley & Sons, 1984, pp. 268–271.

*Primary Examiner*—Robert Pascal
*Assistant Examiner*—Patricia T. Nguyen
*Attorney, Agent, or Firm*—Oblon, Spivak, McClelland, Maier & Neustadt, P.C.

[57] ABSTRACT

An object is to obtain an amplification circuit which provides a high gain even with a low-voltage power supply. The amplification circuit comprises an MOS transistor (M1) having a gate receiving an amplified signal (RFin), a source electrically connected to ground, and a drain electrically connected to a supply voltage (VDD), wherein the back gate-source voltage (Vbs) of the MOS transistor (M1) is made larger as the gate-source voltage (Vgs) of the MOS transistor (M1) becomes larger, thereby making the threshold voltage (VT) of the MOS transistor (M1) smaller.

15 Claims, 6 Drawing Sheets

AMPLIFICATION CIRCUIT

BACKGROUND OF THE INVENTION

1. Field of the Invention

The present invention relates particularly to an amplification circuit which provides a high gain even with a low-voltage power supply.

2. Description of the Background Art

FIG. 13 is a circuit diagram showing a conventional grounded-source amplification circuit, in which a negative-feedback impedance element is connected to the source. In FIG. 13, M1 denotes an N-channel MOS transistor, Z1, ZD, and ZS each denote an impedance element having a DC path, input terminal to which a circuit in the preceding stage (not shown) is connected, RFin denotes a high-frequency signal to be amplified that propagated from the input terminal P1, P2 denotes an output terminal to which a circuit in the following stage (not shown) is connected, RFout denotes an output signal propagating to the output terminal P2, Vgs denotes the voltage at the gate with respect to the source (the gate-source voltage), and Id denotes the drain current.

An impedance element represents a resistance, a capacitor, an inductor, or a combination thereof. A DC path represents an impedance element whose both ends are connected in a DC manner, such as a resistance.

First, the structure of the conventional amplification circuit will be described. The MOS transistor M1 has its gate electrically connected to the input terminal P1, its source electrically connected to ground through the impedance element ZS, its drain connected to a supply voltage VDD through the impedance element ZD and then the impedance element Z1, and its back gate connected to ground. The output terminal P2 is electrically connected to a connection point between the impedance element Z1 and the impedance element ZD.

The source, drain, and gate of the MOS transistor M1 are biased to potentials set so that the MOS transistor M1 operates in the ON region, i.e., in the saturation region or linear region.

Next, the operation of the conventional amplification circuit will be described. Generally, the electric characteristic of the MOS transistor M1 is given by the following equation (1):

$$Id = \frac{\beta}{2}(Vgs - VT)^2 \quad (1)$$

The character $\beta$ is a constant which is determined by manufacture process and device structure (a transconductance constant), and VT is the threshold voltage. In the conventional device, the threshold voltage VT is always constant (=VT0), since the back gate is biased to ground.

The gain AV can be given by the following equation (2) by using the equation (1):

$$Av = Z1 gm \quad (2)$$
$$= Z1\frac{d\,Id}{d\,Vgs}$$
$$= Z1\beta(Vgs - VT)$$

According to the equation (2), a high gain AV can be obtained by increasing the impedance Z1 or the gate-source voltage Vgs.

However, if the impedance Z1 is increased too large, the potential at the drain will become so low that the MOS transistor M1 cannot perform amplifying operation. Further, it is difficult to bias the gate-source voltage Vgs over the supply voltage VDD in a general semiconductor integrated circuit. Accordingly, when the MOS transistor M1 is intended for amplifying operation, the impedance element Z1 and the gate-source voltage Vgs must be set within a limit defined by the supply voltage VDD. Accordingly, as the supply voltage VDD is lower, the impedance element Z1 and the gate-source voltage Vgs cannot be made larger, so that a high gain AV cannot be obtained.

For example, under the condition of supply voltage VDD=0.5 V and threshold voltage VT=0.35 V, the MOS transistor M1 can perform the amplifying operation but the gain AV in this case will be low.

SUMMARY OF THE INVENTION

According to a first aspect of the present invention, an amplification circuit comprises: a first MOS transistor having a gate receiving a signal to be amplified, a source electrically connected to a first fixed potential, and a drain electrically connected to a second fixed potential having a given potential difference with respect to the first fixed potential; and a back gate bias portion for making back gate-source voltage of the first MOS transistor larger as gate-source voltage of the first MOS transistor becomes larger to make threshold voltage of the first MOS transistor smaller, wherein the first MOS transistor has its back gate insulated from a semiconductor substrate.

Preferably, according to a second aspect, the amplification circuit further comprises a first impedance element connected between the second fixed potential and the drain of the first MOS transistor, for converting drain current of the first MOS transistor into voltage.

Preferably, according to a third aspect, in the amplification circuit, the back gate bias portion comprises a second MOS transistor having a gate electrically connected to a connection point between the drain of the first MOS transistor and the first impedance element, and a source electrically connected to the first fixed potential, and a second impedance element connected between the second fixed potential and a drain of the second MOS transistor, for converting drain current of the second MOS transistor into voltage, wherein the first MOS transistor has its back gate electrically connected to a connection point between the drain of the second MOS transistor and the second impedance element.

Preferably, according to a fourth aspect, the amplification circuit further comprises an output terminal electrically connected to a connection point between the drain of the first MOS transistor and the first impedance element.

Preferably, according to a fifth aspect, the amplification circuit further comprises an output terminal electrically connected to a connection point between the drain of the second MOS transistor and the second impedance element.

Preferably, according to a sixth aspect, the amplification circuit further comprises another back gate bias portion for making back gate-source voltage of the second MOS transistor larger as gate-source voltage of the second MOS transistor becomes larger to make threshold voltage of the second MOS transistor smaller.

Preferably, according to a seventh aspect, the amplification circuit further comprises; a third MOS transistor having a gate electrically connected to the connection point between the drain of the second MOS transistor and the second impedance element, and a source electrically connected to the first fixed potential, a third impedance element connected between the second fixed potential and a drain of the third MOS transistor, for converting drain current of the third MOS transistor into voltage, and an output terminal electrically connected to a connection point between the drain of the third MOS transistor and the third impedance element.

Preferably, according to an eighth aspect, the amplification circuit further comprises another back gate bias portion for making back gate-source voltage of the third MOS transistor larger as gate-source voltage of the third MOS transistor becomes larger to make threshold voltage of the third MOS transistor smaller.

Preferably, according to a ninth aspect, in the amplification circuit, the back gate bias portion comprises a connection portion for electrically connecting the gate and back gate of the first MOS transistor.

Preferably, according to a tenth aspect, in the amplification circuit, the connection portion is comprised of a wire for shorting the gate and the back gate.

Preferably, according to an eleventh aspect, in the amplification circuit, the connection portion comprises a biasing impedance element for electrically connecting the gate of the first MOS transistor to the back gate through a given impedance.

Preferably, according to a twelfth aspect, in the amplification circuit, the back gate bias portion comprises a biasing impedance element for connecting the gate and back gate of the first MOS transistor in an AC manner, and a biasing MOS transistor having a gate electrically connected to a connection point between the back gate of the first MOS transistor and the biasing impedance element, a source electrically connected to the first fixed potential, and a drain receiving a constant current.

Preferably, according to a thirteenth aspect, in the amplification circuit, the biasing MOS transistor has its back gate electrically connected to the gate of the biasing MOS transistor.

Preferably, according to a fourteenth aspect, in the amplification circuit, when the signal to be amplified is not propagating to the gate of the first MOS transistor, the back gate bias portion makes the back gate-source voltage of the first MOS transistor smaller to make the threshold voltage of the first MOS transistor larger.

Preferably, according to a fifteenth aspect, the amplification circuit further comprises an output terminal electrically connected to a connection point between the drain of the first MOS transistor and the first impedance element.

According to the first aspect of the present invention, the potential at the back gate of the first MOS transistor is prevented from affecting other transistors. The back gate-source voltage of the first MOS transistor is increased as the gate-source voltage of the first MOS transistor increases, so as to lower the threshold voltage of the first MOS transistor, which increases the gain of the first MOS transistor. Further, larger drain current flows as the amplified signal becomes larger, which increases the gain of the first MOS transistor.

According to the second aspect, the first impedance element and the first MOS transistor form a high-gain voltage amplification circuit.

According to the third aspect, the second MOS transistor and the second impedance element amplify the voltage of the amplified signal in the same phase, which is applied to the back gate of the first MOS transistor. This increases the gain of the first MOS transistor. Further, the gate of the first MOS transistor to which the amplified signal is inputted is electrically separated from the parasitic diode between the back gate and source of the first MOS transistor and they do not affect each other.

According to the fourth aspect, the output terminal is electrically separated from the parasitic diode between the back gate and source of the first MOS transistor, so that they will not affect each other.

According to the fifth aspect, since the amplified signal is amplified by the first and second MOS transistors to be an output signal at the output terminal, the gain is larger than that in the fourth aspect.

According to the sixth aspect, the back gate-source voltage of the second MOS transistor is increased as the gate-source voltage of the second MOS transistor becomes larger, thereby lowering the threshold voltage of the second MOS transistor. This increases the gain of the second MOS transistor.

According to the seventh aspect, the output terminal neither affects nor is affected by the parasitic diode between the back gate and source of the first MOS transistor, and further, the gain can be made larger.

According to the eighth aspect, the back gate-source voltage of the third MOS transistor is increased as the gate-source voltage of the third MOS transistor becomes larger, thereby to lower the threshold voltage of the third MOS transistor, which increases the gain of the third MOS transistor.

According to the ninth aspect, it is possible to increase the back gate-source voltage of the first MOS transistor as the gate-source voltage of the first MOS transistor becomes larger.

According to the tenth aspect, the connection portion can be easily realized by using a wire.

According to the eleventh aspect, the gate of the first MOS transistor is electrically separated from the parasitic diode between the back gate and source, so that they hardly affect each other.

According to the twelfth aspect, the gate-source voltage of the biasing MOS transistor is given to the back gate of the first MOS transistor as a DC bias, so that the biasing impedance element does not have to include a DC path. Even if the amplified signal applied to the gate of the first MOS transistor does not include a DC bias, the gate and the back gate of the first MOS transistor can be supplied with the DC bias from the biasing MOS transistor. Further, since the biasing MOS transistor is affected by ambient temperature similarly to the first MOS transistor, the DC bias can be set easily.

According to the thirteenth aspect, since the biasing MOS transistor is affected by the ambient temperature more similarly to the first MOS transistor, the DC bias can be set more easily.

According to the fourteenth aspect, when the amplified signal is not propagating to the gate of the first MOS transistor, the leakage current flowing between the drain and source of the first MOS transistor is reduced. This reduces wasteful dissipation of power.

According to the fifteenth aspect, the output terminal is electrically separated from the parasitic diode between the back gate and source of the first MOS transistor, so that they will not affect each other.

The present invention has been made to solve the above-described problems, and an object of the present invention is to obtain an amplification circuit which can provide a high gain even with a low-voltage power supply.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
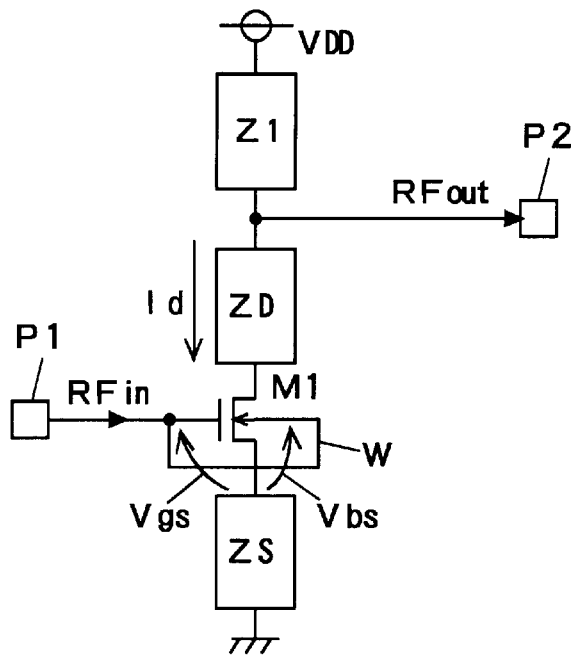
FIG. 1 is a circuit diagram showing an amplification circuit according to a first preferred embodiment of the present invention.
Figure 13:
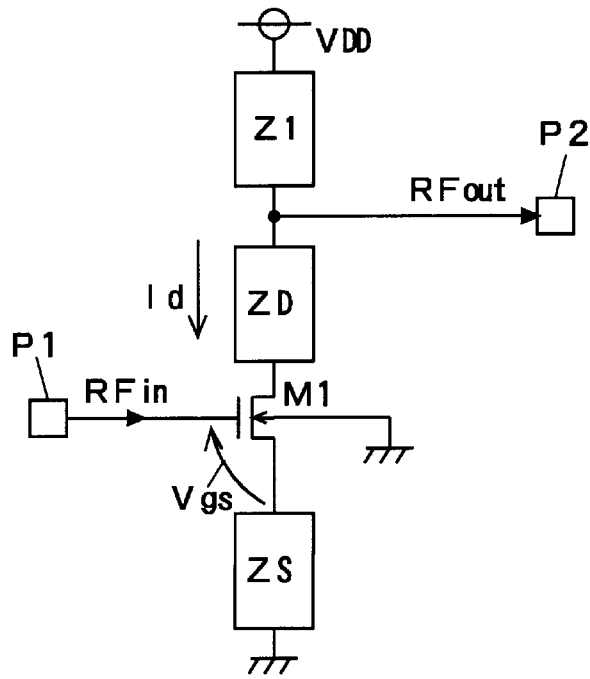
FIG. 13 is a circuit diagram showing a conventional amplification circuit.

FIG. 1 is a circuit diagram showing a grounded-source amplification circuit according to a first preferred embodiment. In FIG. 1, W denotes a connection for electrically connecting the gate and the back gate of the MOS transistor M1, Vbs denotes the voltage at the back gate with respect to the source (the back gate-source voltage), and the other reference characters correspond to those in FIG. 13.

In the structure of the amplification circuit of the first preferred embodiment, the connection W electrically shorts the gate and the back gate. In other respects, the structure is the same as that of the conventional circuit shown in FIG. 13.

In the first preferred embodiment, the MOS transistor M1 corresponds to a first MOS transistor, ground corresponds to a first fixed potential, the supply voltage VDD corresponds to a second fixed potential having a given potential difference with respect to ground, the impedance element Z1 corresponds to a first impedance element, and the connection W corresponds to a back gate bias portion.

The connection W is provided to electrically connect the gate and the back gate of the MOS transistor M1, which may be composed of only a wire, for example.

If not required, the impedance element ZS and the impedance element ZD respectively given to the source and the drain of the MOS transistor M1 may be omitted.

Similarly to the conventional circuit, the source, drain, and gate of the MOS transistor M1 are biased to potentials set so that the MOS transistor M1 can operate in the ON region, or the saturation region or linear region.

Next, the operation of the amplification circuit of the first preferred embodiment will now be described. The threshold voltage VT is given by the following equation (3):

$$VT = VT0 + \gamma\left[\sqrt{|2\phi F - Vbs|} - \sqrt{|2\phi F|}\right] \qquad (3)$$

The character $\phi F$ is a constant determined by the impurity density of the substrate, which is called a surface potential, and $\gamma$ is a substrate bias effect factor.

As the amplified signal RFin becomes larger, the back gate-source voltage Vbs becomes larger with the gate-source voltage Vgs. As the back gate-source voltage Vbs becomes larger, the threshold voltage VT becomes smaller, as can be seen from the equation (3). Accordingly, from the equation (2), the MOS transistor M1 provides a higher gain AV than the conventional one.

Furthermore, since the threshold voltage VT becomes smaller as the gate-source voltage Vgs becomes larger, a larger drain current Id than that in the conventional one flows, from the equation (2). Particularly, as the amplified signal RFin becomes larger, the drain current Id increases more considerably, as compared with the conventional one. Hence, when the amplified signal RFin is larger and the output signal RFout varies largely, the capacitance at the output terminal P2 is charged/discharged at a higher rate.

The drain current Id is converted by the impedance element Z1 into the output signal RFout in voltage. That is to say, as the voltage of the amplified signal RFin applied to the input terminal P1 varies, the drain current Id varies, and the voltage drop by the impedance element Z1 causes the voltage of the output signal RFout to largely vary.

Since a larger drain current Id is obtained than in the conventional one, the layout area for the MOS transistor M1 can be smaller, which prevents deterioration of the high-frequency characteristic caused by an increased layout area.

Figure 2:
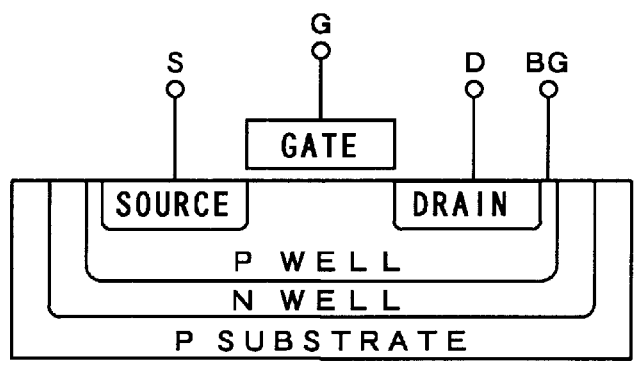
FIG. 2 is a diagram showing an example of a three-well structure to which the present invention is applied.
Figure 3:
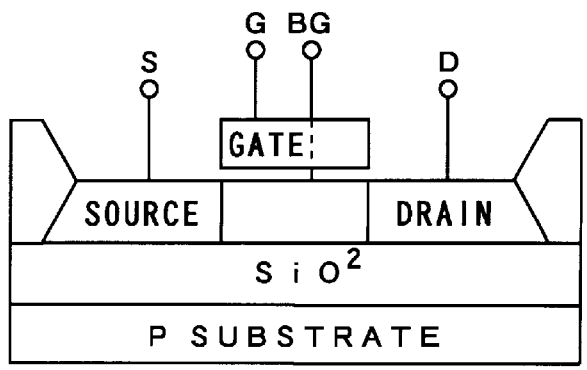
FIG. 3 is a diagram showing an example of an SOI (Silicon On Insulator) structure to which the present invention is applied.

When a plurality of transistors are fabricated in one substrate in addition to the MOS transistor M1, a substrate having a 3-well structure shown in FIG. 2 or an SOI (Silicon On Insulator) structure shown in FIG. 3 is used, for example. In such a substrate, the semiconductor substrate of the P substrate and the back gate are insulated, so that the potential at the back gate can be separated for each of the plurality of transistors. In FIG. 2 and FIG. 3, G, S, D, and BG correspond to the gate, source, drain, and back gate terminals of the MOS transistor M1, respectively. These structures enable the potential at the back gate to be controlled for each transistor so that the potential at the back gate of the MOS transistor M1 will not affect other transistors.

Figure 4:
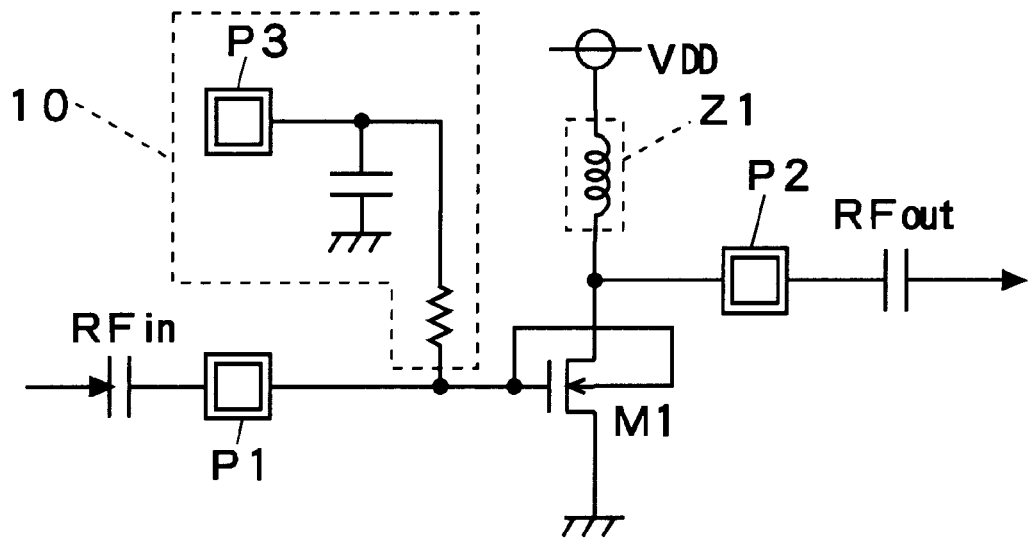
FIG. 4 is a circuit diagram showing an example of the amplification circuit according to the first preferred embodiment of the present invention.

FIG. 4 shows an example of a low-noise amplifier made by applying the first preferred embodiment. In FIG. 4, 10 denotes a bias circuit for applying DC bias to the gate and the back gate of the MOS transistor M1, P3 denotes a terminal for applying the DC bias, and the other characters correspond to those in FIG. 1. The impedance element Z1 is an inductor, and the impedance element ZS and the impedance element ZD are not present. The amplified signal RFin is applied to the input terminal P1 through a capacitor and the output signal RFout is taken out from the output terminal P2 through a capacitor.

Figure 5:
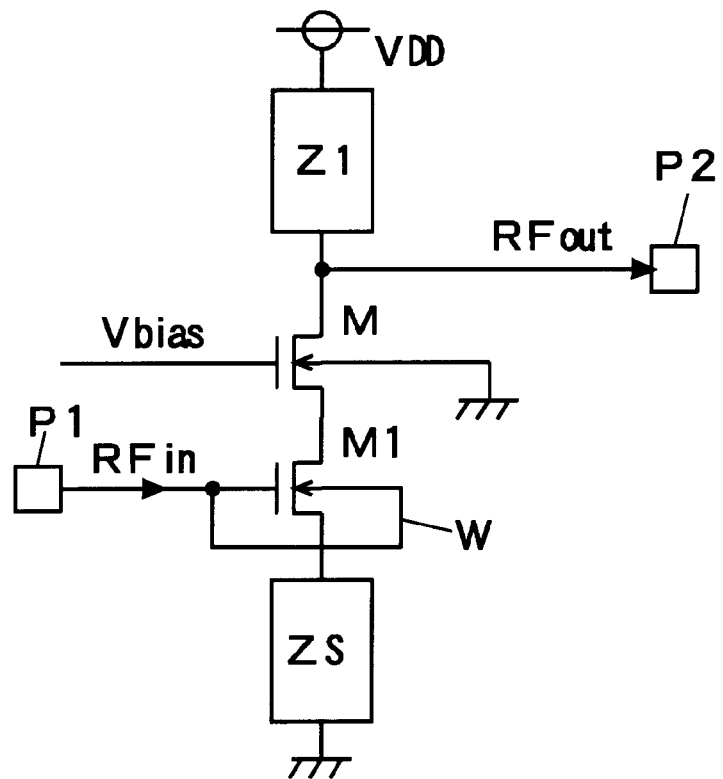
FIG. 5 is a circuit diagram showing an example of an amplification circuit of the present invention, which includes a transistor for reducing the channel-length modulation effect.

When it is desirable to reduce the Miller effect and the channel-length modulation effect of the MOS transistor M1, as shown in FIG. 5, a MOS transistor M is provided with its gate receiving a constant bias voltage Vbias, its source connected to the drain of the MOS transistor M1, its drain connected to the impedance element Z1, and its back gate connected to ground. The formation of the MOS transistor M can be applied not only to the first preferred embodiment but also to the second to seventh preferred embodiments described below.

Second Preferred Embodiment

Figure 6:
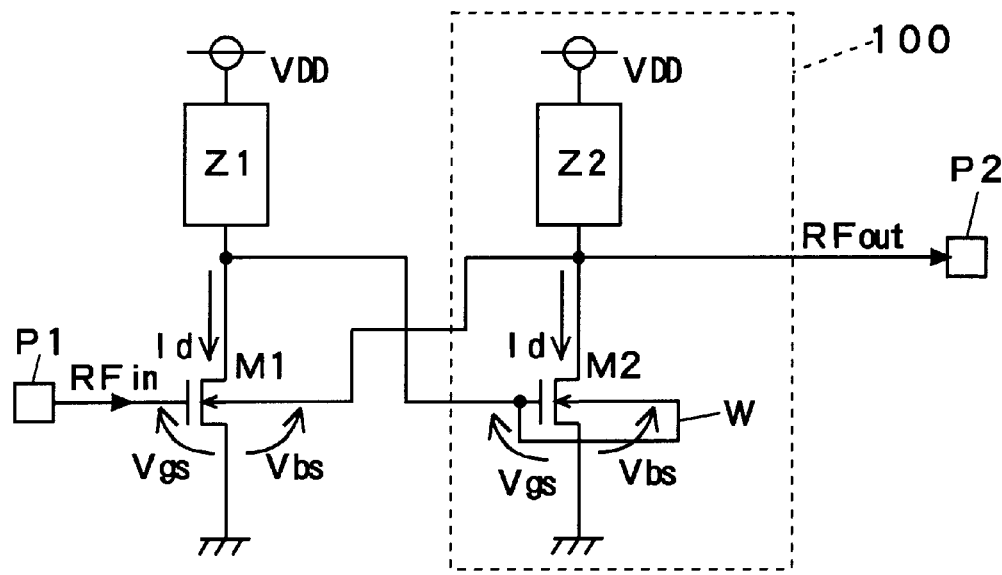
FIG. 6 is a circuit diagram showing an amplification circuit according to a second preferred embodiment of the present invention.

FIG. 6 is a circuit diagram showing a grounded-source amplification circuit according to a second preferred embodiment. In FIG. 6, M2 denotes an N-channel MOS transistor, Z2 denotes an impedance element having a DC path, and other reference characters correspond to those in FIG. 1.

Next, the structure of the amplification circuit of the second preferred embodiment will be described. The MOS transistor M2 has its gate electrically connected to a connection point between the drain of the MOS transistor M1 and the impedance element Z1, its source electrically connected to ground, and its drain electrically connected to the supply voltage VDD through the impedance element Z2. The back gate of the MOS transistor M1 is electrically connected to a connection point between the MOS transistor M2 and the impedance element Z2. The gate and the back gate of the MOS transistor M2 are electrically connected through a connection W (another back gate bias portion). The output terminal P2 is connected to the connection point between the MOS transistor M2 and the impedance element Z2. The structure is the same as that of the first preferred embodiment in other respects.

The MOS transistor M2 corresponds to a second MOS transistor, the impedance element Z2 corresponds to a second impedance element, and the MOS transistor M2, the impedance element Z2, and the connection W are included in the back gate bias portion 100.

If needed, impedance elements like the impedance element ZS and the impedance element ZD may be given to the source and the drain of the MOS transistor M2. Further, impedance elements may be provided to the back gate of the MOS transistor M1 and to the gate of the MOS transistor M2.

The back gate of the MOS transistor M2 may be connected to ground.

Next, the operation of the amplification circuit of the second preferred embodiment will be described. The MOS transistor M1 and the impedance element Z1 form an opposite-phase voltage amplification circuit. Accordingly, the voltage of the amplified signal RFin applied to the input terminal P1 is amplified in opposite phase and applied to the gate and the back gate of the MOS transistor M2. Then, similarly to the MOS transistor M1 described in the first preferred embodiment, the MOS transistor M2 provides a higher gain AV as the gate-source voltage Vgs and the back gate-source voltage Vbs of the MOS transistor M2 become larger.

Since the MOS transistor M2 and the impedance element Z2 form an opposite-phase voltage amplification circuit, too, the voltage at the connection point between the drain of the MOS transistor M2 and the impedance element Z2 is in phase with the amplified signal RFin. The voltage at this connection point is applied to the back gate of the MOS transistor M1. Hence, since the back gate-source voltage Vbs of the MOS transistor M1 corresponds to in-phase amplification of the amplified signal RFin amplified by the MOS transistors M1 and M2, it is still larger than that in the first preferred embodiment which uses the amplified signal RFin itself. Accordingly, the gain AV of the MOS transistor M1 is higher than that in the first preferred embodiment. When a larger amplified signal RFin is inputted, the capacitance at the output terminal P2 can be charged/discharged at a still higher rate, as compared with the first preferred embodiment.

Since the input terminal P1 is not electrically connected to the back gate of the MOS transistor M1, it is electrically separated from the parasitic diode between the back gate and source of the MOS transistor M1, and they do not affect each other. This allows a matching circuit (not shown) connected to the input terminal P1 to be constructed simply. This is particularly effective when the amplified signal RFin is a high-frequency signal (e.g., in L band).

The connection point between the drain of the MOS transistor M1 and the impedance element Z1 and the gate of the MOS transistor M2 may be connected through a capacitor to apply DC bias to the gate of the MOS transistor M2.

Third Preferred Embodiment

Figure 7:
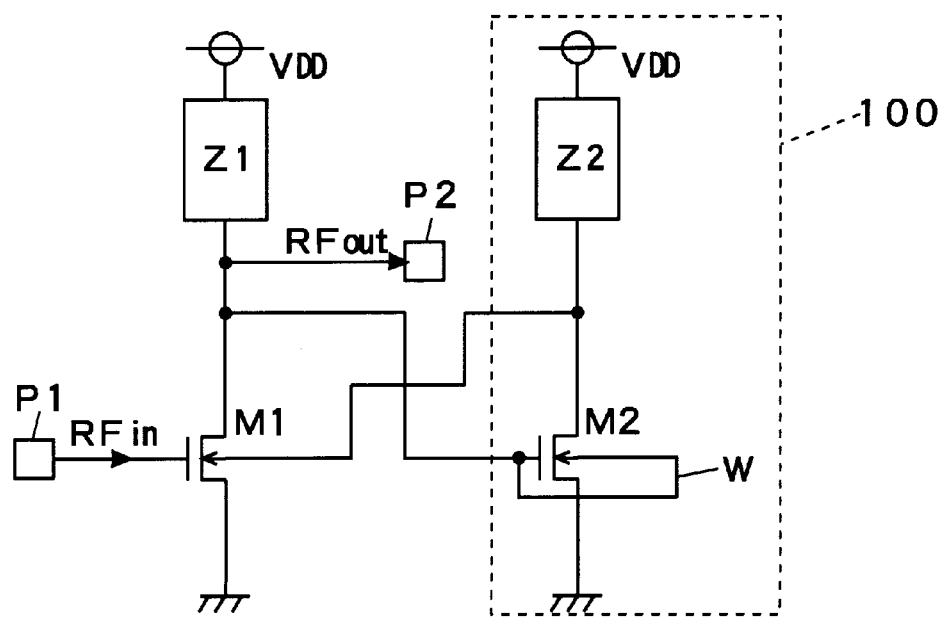
FIG. 7 is a circuit diagram showing an amplification circuit according to a third preferred embodiment of the present invention.

FIG. 7 is a circuit diagram showing a grounded-source amplification circuit according to a third preferred embodiment of the present invention. In the third preferred embodiment, the output terminal P2 is electrically connected to a connection point between the drain of the MOS transistor M1 and the impedance element Z1. The structure is the same as that of the second preferred embodiment in other respects.

Unlike the second preferred embodiment, the output terminal P2 is not electrically connected to the back gate of the MOS transistor M1 in the third preferred embodiment. Accordingly, it is electrically isolated from the parasitic diode between the back gate and source of the MOS transistor M1, and they therefore do not affect each other. Further, when the back gate of the MOS transistor M2 is disconnected from the gate of the MOS transistor M2 and is connected to ground, the output terminal P2 is not electrically connected to the back gate of the MOS transistor M2, either. Then it is electrically separated from the parasitic diode between the back gate and source of the MOS transistor M2, too, and they do not affect each other. Then the structure of a matching circuit (not shown) connected to the output terminal P2 can be simplified.

Fourth Preferred Embodiment

Figure 8:
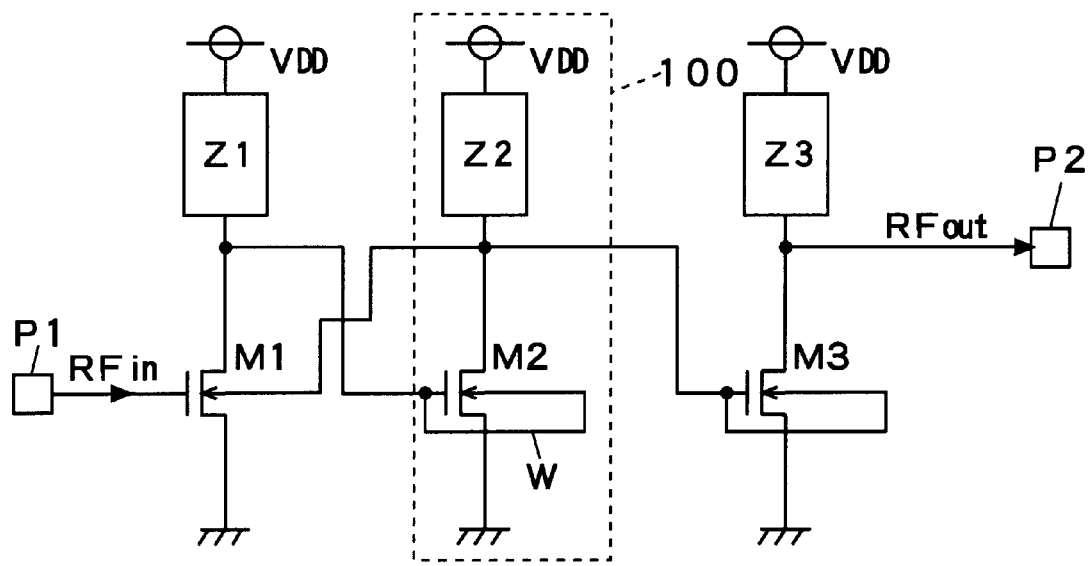
FIG. 8 is a circuit diagram showing an amplification circuit according to a fourth preferred embodiment of the present invention.

FIG. 8 is a circuit diagram showing a grounded-source amplification circuit according to a fourth preferred embodiment. In FIG. 8, M3 denotes an N-channel MOS transistor, Z3 denotes an impedance element having a DC path, and the other reference characters correspond to those in FIG. 6.

Next, the structure of the amplification circuit of the fourth preferred embodiment will be described. The gate of the MOS transistor M3 is electrically connected to a connection point between the drain of the MOS transistor M2 and the impedance element Z2. The source of the MOS transistor M3 is electrically connected to ground. The drain of the MOS transistor M3 is electrically connected to the supply voltage VDD through the impedance element Z3. The gate and back gate of the MOS transistor M3 are electrically connected through a connection (another back gate bias portion). The output terminal P2 is connected to a connection point between the drain of the MOS transistor M3 and the impedance element Z3. The structure is the same as that of the second preferred embodiment in other respects.

The MOS transistor M3 corresponds to a third MOS transistor, and the impedance element Z3 corresponds to a third impedance element.

If required, an impedance element may be provided to the gate, source, or drain of the MOS transistor M3.

As compared with the second preferred embodiment, the above-described third preferred embodiment has the advantage that the output terminal P2 is electrically connected to the connection point between the drain of the MOS transistor M1 and the impedance element Z1 so that it will neither affect nor be affected by the parasitic diode between the back gate and source of the MOS transistor M1. However, the gain AV will be lower than that in the second preferred embodiment.

Accordingly, in the fourth preferred embodiment, a voltage amplification circuit including the MOS transistor M3 and the impedance element Z3 is added to the structure of the second preferred embodiment so as to electrically separate the output terminal P2 from the parasitic diode between the back gate and source of the MOS transistor M1 so that they will not affect each other, and also to obtain a still larger gain AV than that in the second preferred embodiment.

Although the back gate of the MOS transistor M3 is electrically connected to the gate of the MOS transistor M3 in FIG. 8, it may be separated from the gate of the MOS transistor M3 and connected to ground.

Furthermore, although a voltage amplification circuit of a single stage composed of the MOS transistor M3 and the impedance element Z3 is added in FIG. 8, a voltage amplification circuit having a plurality of stages may be provided.

Fifth Preferred Embodiment

Figure 9:
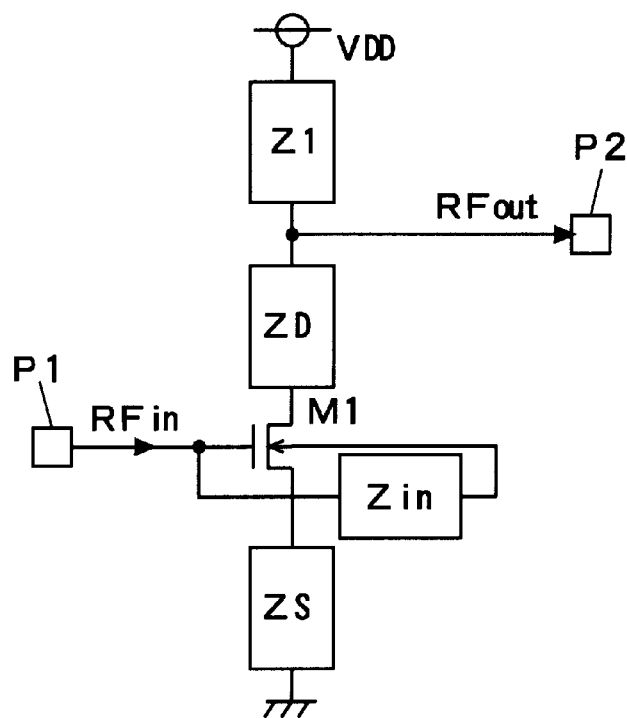
FIG. 9 is a circuit diagram showing an amplification circuit according to a fifth preferred embodiment of the present invention.

FIG. 9 is a circuit diagram showing a grounded-source amplification circuit according to a fifth preferred embodiment. In FIG. 9, Zin denotes an impedance element having a DC path, and the other reference characters correspond to those in FIG. 1.

In the structure of the amplification circuit of the fifth preferred embodiment, the gate and the back gate of the MOS transistor M1 are electrically connected through the impedance element Zin. The structure is the same as that of the first preferred embodiment in other respects.

In the fifth preferred embodiment, the impedance element Zin corresponds to a biasing impedance element included in the back gate bias portion.

It is assumed here that the bias circuit 10 shown in FIG. 4 is used, for example, and the impedance element Zin has a DC path to apply a DC bias generated from the bias circuit 10 also to the back gate of the MOS transistor M1.

In the fifth preferred embodiment, the gate of the MOS transistor M1 is connected to the back gate through the impedance element Zin, so that the input terminal P1 is electrically separated from the parasitic diode between the back gate and source and they do not affect each other. This allows simplification of the structure of a matching circuit (not shown) connected to the input terminal P1. Further, when the impedance element Zin is formed as a part of the matching circuit, the structure of the matching circuit can be simplified more.

The fifth preferred embodiment may be applied also to the MOS transistor M2 of the second to fourth preferred embodiments or the MOS transistor M3 of the fourth preferred embodiment.

Sixth Preferred Embodiment

Figure 10:
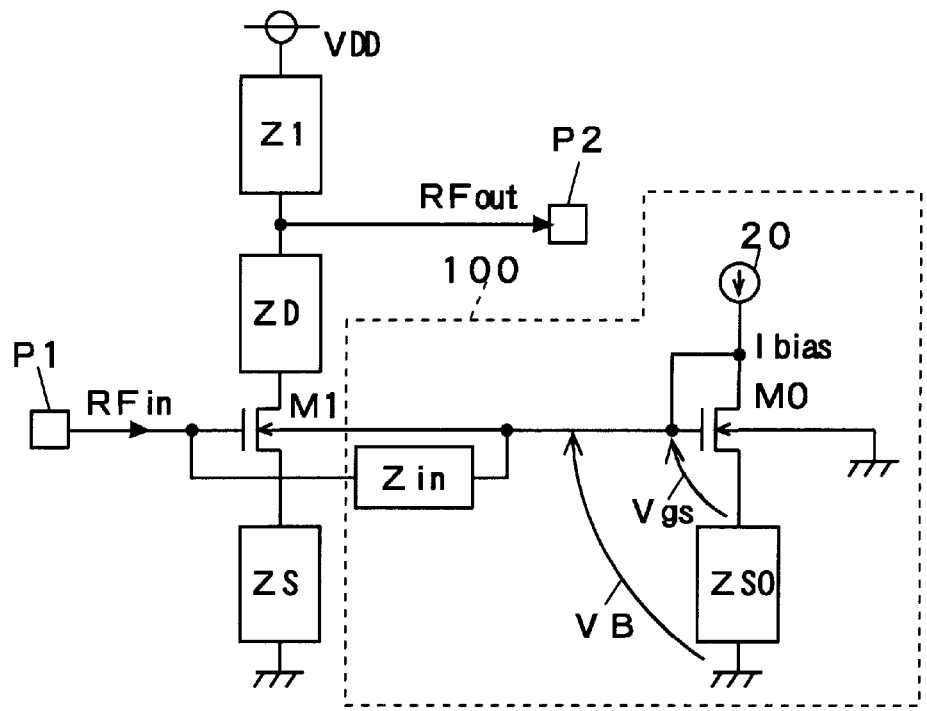
FIG. 10 is a circuit diagram showing an amplification circuit according to a sixth preferred embodiment of the present invention.

FIG. 10 is a circuit diagram showing a grounded-source amplification circuit according to a sixth preferred embodiment. In FIG. 10, M0 denotes an N-channel MOS transistor, ZS0 denotes an impedance element having a DC path, 20 denotes a constant current source for arbitrarily setting and generating a bias current, Ibias, and the other reference characters correspond to those in FIG. 9.

Next, the structure of the amplification circuit of the sixth preferred embodiment will be described. The source of the MOS transistor M0 is electrically connected to ground through the impedance element ZS0. The drain of the MOS transistor M0 receives the bias current Ibias. The gate of the MOS transistor M0 is electrically connected to the back gate of the MOS transistor M1 and the drain of the MOS transistor M0. The back gate of the MOS transistor M0 is electrically connected to ground. In other respects, the structure is the same as that of the fifth preferred embodiment.

The impedance element Zin in the sixth preferred embodiment includes an AC path, not a DC path. The AC path represents an impedance element having its both ends connected in an AC manner, such as a capacitor.

In the sixth preferred embodiment, the MOS transistor M0 corresponds to a biasing MOS transistor, the impedance element Zin corresponds to a biasing impedance element, and the MOS transistor M0, the impedance element Zin, the impedance element ZS0, and the constant current source 20 are included in the back gate bias portion 100.

The impedance element ZS0 may be omitted, if not necessary.

The drain and the gate of the MOS transistor M0 are connected so that the MOS transistor M0 certainly turns on.

Next, the operation of the amplification circuit of the sixth preferred embodiment will be described. The gate-source voltage Vgs of the MOS transistor M0 can be obtained by using the equation (1). The voltage VB at the gate of the MOS transistor M0 with respect to ground corresponds to a sum of the gate-source voltage Vgs of the MOS transistor M0 and the voltage at the impedance element ZS0, which is given as:

$$VB = VT + \sqrt{\frac{2\,Ibias}{\beta}} + Ibias \times ZS0 \qquad (4)$$

In the fifth preferred embodiment, a DC path is included in the impedance element Zin to provide the DC bias to the back gate of the MOS transistor M1. In the sixth preferred embodiment, since the voltage VB is provided to the back gate of the MOS transistor M1 as a DC bias, it is not necessary to include a DC path in the impedance element Zin.

Even when the amplified signal RFin applied to the input terminal P1 does not include a DC bias, the gate and the back gate of the MOS transistor M1 can be supplied with a DC bias from the back gate bias portion 100.

Further, since the MOS transistor M0 is affected by the ambient temperature similarly to the MOS transistor M1, the DC bias can easily be set to a proper value in accordance with the ambient temperature.

Figure 11:
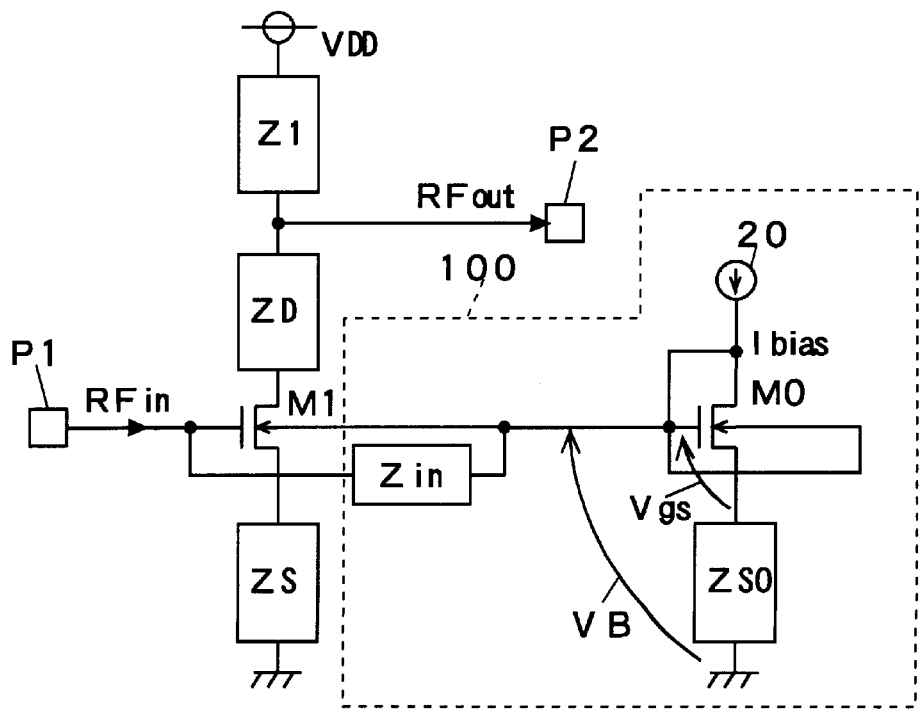
FIG. 11 is a circuit diagram showing an amplification circuit according to the sixth preferred embodiment of the present invention.

Moreover, as shown in FIG. 11, when the back gate of the MOS transistor M0 is electrically connected to the gate of the MOS transistor M0 similarly to those of the MOS transistor M1, the influence of the ambient temperature on the MOS transistor M0 will be further closer to that of the ambient temperature on the MOS transistor M1, which will make the setting of the DC bias still easier.

Figure 12:
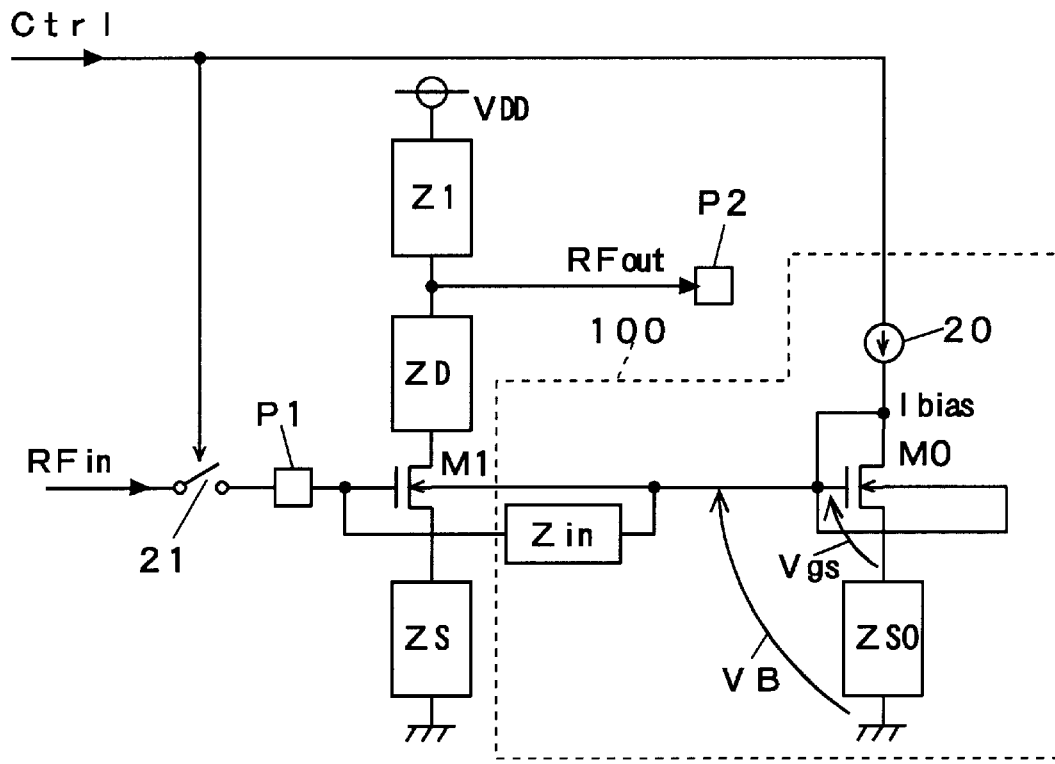
FIG. 12 is a circuit diagram showing an amplification circuit according to the sixth preferred embodiment of the present invention.

FIG. 12 shows a modification of the circuit shown in FIG. 11. In the circuit shown in FIG. 12, the amplified signal RFin is applied to the gate of the MOS transistor M1 in a time-division manner, or in desired periods, instead of being always applied to the gate of the MOS transistor M1. Whether to apply the amplified signal RFin to the gate of the MOS transistor M1 can be controlled with a switch 21 having its one end connected to the input terminal P1, receiving the amplified signal RFin at the other end, and controlled between ON and OFF by a control signal Ctrl indicating the desired periods, for example. The control signal Ctrl also controls the constant current source 20.

When the control signal Ctrl indicates a desired period, the switch 21 turns on and the amplified signal RFin is applied to the gate of the MOS transistor M1, and the constant current source 20 outputs the bias current Ibias.

When the control signal Ctrl indicates a period other than the desired period, the switch 21 turns off and the amplified signal RFin is not applied to the gate of the MOS transistor M1, and the constant current source 20 does not output the bias current Ibias. When the bias current Ibias does not flow, the voltage VB decreases first, and the back gate-source voltage of the MOS transistor M1 decreases, and then the threshold voltage of the MOS transistor M1 becomes larger. The larger threshold voltage of the MOS transistor M1 reduces the leakage current flowing between the drain and source of the MOS transistor M1. This reduces wasteful consumption of power.

The modification is not limited to the above-described example. When the back gate bias portion is constructed so that the back gate-source voltage of the MOS transistor M1 is decreased so as to make the threshold voltage of the MOS transistor M1 larger when the amplified signal RFin is not propagating to the gate of the MOS transistor M1, i.e., when the amplification circuit is in an OFF state, then the leakage current flowing between the drain and source of the MOS transistor M1 is reduced, which reduces the wasteful consumption of power.

The sixth preferred embodiment may be applied also to the MOS transistor M2 of the second to fourth preferred embodiments or to the MOS transistor M3 of the fourth preferred embodiment.

Modification

The present invention can be applied not only to N-channel MOS transistors, but also to P-channel MOS transistors.

While the invention has been described in detail, the foregoing description is in all aspects illustrative and not restrictive. It is understood that numerous other modifications and variations can be devised without departing from the scope of the invention.

We claim:

1. An amplification circuit comprising:
   a first MOS transistor having a gate receiving a signal to be amplified, a back gate insulated from a semiconductor substrate on which said first MOS transistor is provided, a source electrically connected to a first fixed potential, and a drain electrically connected to a second fixed potential having a given potential difference with respect to said first fixed potential; and
   a back gate bias portion configured to make back gate-source voltage of said first MOS transistor larger as gate-source voltage of said first MOS transistor becomes larger to make threshold voltage of said first MOS transistor smaller.

2. The amplification circuit according to claim 1, further comprising a first impedance element connected between said second fixed potential and the drain of said first MOS transistor, for converting drain current of said first MOS transistor into voltage.

3. The amplification circuit according to claim 2, wherein said back gate bias portion comprises,
   a second MOS transistor having a gate electrically connected to a connection point between the drain of said first MOS transistor and said first impedance element, and a source electrically connected to said first fixed potential, and
   a second impedance element connected between said second fixed potential and a drain of said second MOS transistor, for converting drain current of said second MOS transistor into voltage,
   and wherein said first MOS transistor has its back gate electrically connected to a connection point between the drain of said second MOS transistor and said second impedance element.

4. The amplification circuit according to claim 2, further comprising an output terminal electrically connected to a connection point between the drain of said first MOS transistor and said first impedance element.

5. The amplification circuit according to claim 3, further comprising an output terminal electrically connected to a connection point between the drain of said second MOS transistor and said second impedance element.

6. The amplification circuit according to claim 3, further comprising another back gate bias portion for making back gate-source voltage of said second MOS transistor larger as gate-source voltage of said second MOS transistor becomes larger to make threshold voltage of said second MOS transistor smaller.

7. The amplification circuit according to claim 3, further comprising;
   a third MOS transistor having a gate electrically connected to said connection point between the drain of said second MOS transistor and said second impedance element, and a source electrically connected to said first fixed potential,
   a third impedance element connected between said second fixed potential and a drain of said third MOS transistor, for converting drain current of said third MOS transistor into voltage, and
   an output terminal electrically connected to a connection point between the drain of said third MOS transistor and said third impedance element.

8. The amplification circuit according to claim 7, further comprising another back gate bias portion for making back gate-source voltage of said third MOS transistor larger as gate-source voltage of said third MOS transistor becomes larger to make threshold voltage of said third MOS transistor smaller.

9. The amplification circuit according to claim 1, wherein said back gate bias portion comprises a connection portion for electrically connecting the gate and back gate of said first MOS transistor.

10. The amplification circuit according to claim 9, wherein said connection portion is comprised of a wire for shorting said gate and said back gate.

11. The amplification circuit according to claim 9, wherein said connection portion comprises a biasing impedance element for electrically connecting the gate of said first MOS transistor to said back gate through a given impedance.

12. The amplification circuit according to claim 1, wherein said back gate bias portion comprises, a biasing impedance element for connecting the gate and back gate of said first MOS transistor in an AC manner, and a biasing MOS transistor having a gate electrically connected to a connection point between the back gate of said first MOS transistor and said biasing impedance element, a source electrically connected to said first fixed potential, and a drain receiving a constant current.

13. The amplification circuit according to claim 12, wherein said biasing MOS transistor has its back gate electrically connected to the gate of said biasing MOS transistor.

14. The amplification circuit according to claim 1, wherein when said signal to be amplified is not propagating to the gate of said first MOS transistor, said back gate bias portion makes the back gate-source voltage of said first MOS transistor smaller to make the threshold voltage of said first MOS transistor larger.

15. The amplification circuit according to claim 3, further comprising an output terminal electrically connected to a connection point between the drain of said first MOS transistor and said first impedance element.

* * * * *